United States Patent [19]

Komiyama

[11] Patent Number: 4,654,228
[45] Date of Patent: Mar. 31, 1987

[54] PROCESS FOR PREPARATION OF CERAMIC FILM

[75] Inventor: Hiroshi Komiyama, Tokyo, Japan

[73] Assignees: Kureha Chemical Industry Co., Ltd.; Idemitsu Kosan Company Limited, both of Tokyo, Japan; part interest to each

[21] Appl. No.: 813,102

[22] Filed: Dec. 24, 1985

[30] Foreign Application Priority Data

Dec. 27, 1984 [JP] Japan .................................. 59-273994

[51] Int. Cl.$^4$ ............................................. B05D 1/00
[52] U.S. Cl. ................................ 427/180; 427/255.2; 427/255.3
[58] Field of Search .................. 427/180, 255.2, 255.3, 427/294

[56] References Cited

PUBLICATIONS

Simpkins et al, J. Appl. Phys. Sep. 1976, 50(9), pp. 5676, 5681.

Primary Examiner—Richard Bueker
Attorney, Agent, or Firm—Flynn, Thiel, Boutell & Tanis

[57] ABSTRACT

A process for preparing a ceramic film wherein ultrafine particles of ceramics are produced in a vapor phase, a substrate is kept at a temperature lower than the temperature where the ultrafine particles are produced but high enough to allow the vapor phase reaction to proceed, forming a temperature gradient between the vapor phase and the substrate and thereby to deposit the ultrafine particles onto the substrate by utilizing a thermophoretic phenomenon, and the vapor phase reaction is allowed to continue on the ultrafine particles deposited on the substrate. After the formation of the film, the deposition of the ultrafine particles onto the substrate may be stopped while continuing the vapor reaction in the formed film to prepare a more dense film having reduced voids.

9 Claims, 7 Drawing Figures

Diffraction angle 2θ, degree

PROCESS FOR PREPARATION OF CERAMIC FILM

BACKGROUND OF THE INVENTION

1. Field of the Invention

This invention relates to a process for preparing a ceramic film, and more particularly to a process for preparing a ceramic film which enables rapid film formation. In this process pore size can be controlled and the resultant film can be both uniform and thick.

2. Prior Arts

Ceramic films are used as thermal insulating materials, filtering medium, or the like, and recently developed porous glass is expected to be widely used as a high-temperature gas separating material or a sinterable matrix for a sintered material of high density.

As a method for preparing ceramic powders, there can be mentioned a vapor phase method, a liquid phase method or a solid phase method. Of these methods, the vapor phase method is the most desirable in that the purification of the raw material can be effected easily so that ceramics of high purity can be obtained. Also, surface contamination of fine particles with large specific areas rarely occurs in this method.

In the usual method for preparing a film of ceramics, material powders are synthesized by a liquid and a solid phase reaction, and the resultant solid is then pulverized, sieved and sintered. This method, however, is not suitable for preparation of a ceramic film of high purity and of fine pores.

Recently, a method of sintering ultrafine particles synthesized by a vapor phase reaction was proposed (*Ceramics*, Vol. 19, No. 6 (1984), p. 469). The production process of this method, however, is very complicated and there are possibilities of impurity contamination. Furthermore, in the case of a porous glass having ultrafine pores of 100A or less, it may be possible to prepare a material of $SiO_2$ having ultrafine pores by eluting sodium borate from boron silicate glass of entangled structure, but this method is not general and can not be widely employed.

Thus, there has not heretofore been a general method which is applicable to a wide range of films having a high purity and desired porosity. In connection to this, it is to be noted that, as a method for preparing a sinterable matrix to obtain a dense sintered material, there has been known a method for preparing the porous glass as described above from silica, but again this method is not general.

As a film forming technique for directly obtaining a ceramic film, there is the CVD (Chemical Vapor Deposition) method or PVD (Physical Vapor Deposition) method. In the case of ceramics, the PVD method is such that the sputtering process using an oxide as a target, is employable, but this is disadvantageous in that the film formation speed is as low as 1 μm/hr or less. Whereas, CVD method has an advantage that the film formation speed is high and the obtained film has a desired crystallizability so that multi-component film can easily be prepared. Thus, this method is the most desirable among the conventional methods.

The CVD method, however, has another drawback. According to this method, although the film formation speed can generally be increased by increasing the concentration of the reactive material the uniformity of the film is deteriorated as the concentration is increased and particles which suppress the formation of the film are undesiredly produced in the vapor phase when the concentration exceeds a certain limit. Thus, in relation with such a possible undesired result of production of particles in the vapor phase, the conventional CVD method, in which solids are allowed to grow only on the substrate, has an upper limit in the concentration of the reactive materials. By this reason, the film formation speed is suppressed to 20 μm/hr or less and if uniform film formation is desired, it is further suppressed to approximately 1 to 5 μm/hr.

The problems involved in the conventional techniques to be obviated by the present invention are summarized as follows:

(1) The conventional methods include a number of steps and the process is complicated so that there is a possibility of contamination. In other words, there is no method which is simple and energy efficient.

(2) The conventional process which is capable of directly obtaining a dense ceramic film is disadvatageous because the film formation speed is low.

SUMMARY OF THE INVENTION

It is therefore an object of the present invention to provide a process for preparing a ceramic film which is capable of rapidly forming a film and yet forms a uniform and thick film and further capable of easily controlling the pore size of the film and capable of forming a film from material gases within a single reaction apparatus, which would prevent contamination with impurities and allow energy efficiency.

Furthermore, when it is desired to prepare a denser ceramic film, sintering can be effected within the same apparatus in which the film has been prepared.

In the conventional CVD method, it is essential that the formation of solids should be effected only on the substrate and the formation of particles in the vapor phase is undesirable. Therefore, to prevent the formation of the particles in the vapor phase, the substrate is kept at a temperature where a reaction can proceed and the vapor phase is kept at a temperature where the reaction cannot proceed.

In contrast, according to the present invention, ultrafine particles are positively produced in the vapor phase and the resultant ultrafine particles are deposited on the substrate and the vapor reaction is further allowed to proceed on the substrate.

DETAILED DESCRIPTION OF THE INVENTION

Figure 1:
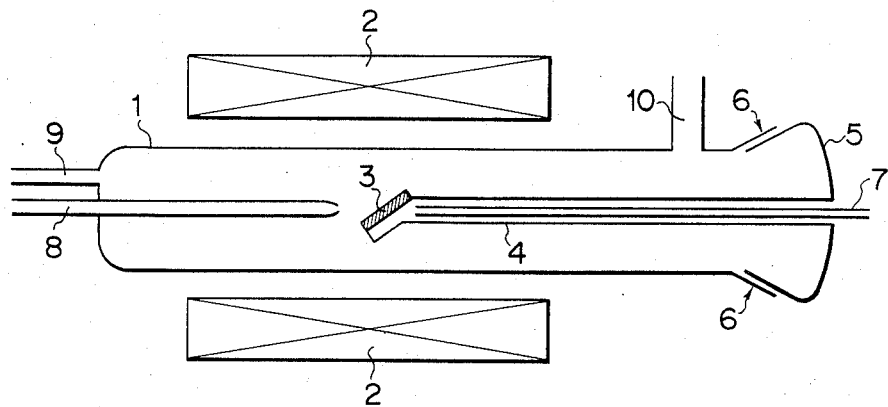
FIG. 1 is one form of a reaction apparatus employable to carry out the present invention.

The present invention features a process for preparing a ceramic film, which comprises producing ultrafine particles of ceramics by a vapor phase reaction, providing a temperature gradient between a vapor phase and a substrate by holding the substrate at a temperature lower than that of the vapor phase where the ultrafine particles are produced but high enough to allow the vapor phase reaction to proceed, allowing the ultrafine particles produced in the vapor phase to be deposited onto the substrate by a thermophoretic phenomenon; and allowing the vapor reaction to proceed on the ultrafine particles deposited on the substrate.

In this invention, the temperature of the substrate is maintained lower than that of the vapor phase so as to allow the ultrafine particles produced in the vapor phase to be deposited on the substrate by thermophoresis. For example, in an atmosphere kept at a specific reaction temperature where ultrafine particles are produced in the vapor phase by a vapor phase reaction, a substrate is introduced and is kept at a temperature lower than that of the vapor phase. Thus, a temperature gradient is produced around the substrate. Due to this temperature gradient, ultrafine particles produced in the vapor phase are diffused towards the substrate by a thermophoretic phenomenon and deposited thereon.

It is known that the thermophoresis speed Vt is given by the following formula, irrespective of the particle size dp, when the particle size dp is smaller than the mean free path length of gas molecules λ (e.g., Kanji Takahashi, *Basic Aerosol Engineering*, by Yohkendo Shoten, 1982, pp. 32–36).

$$Vt = \frac{-3}{4(1 + \pi/8\alpha_m)} \cdot \frac{\nu}{T} \cdot \frac{dT}{dX}$$

where $\alpha_m$ is a constant of from 0.8 to 1, $\nu$ is a kinematic viscosity, T is a gas temperature, $dT/dX$ is a gradient of a gas temperature. Since $\nu$ is in proportion to $T^{3/2}$, $\nu/T$ is in proportion to $T^{\frac{1}{2}}$. Therefore, in formula (1), Vt is determined by $dT/dX$ which is in turn determined by operating conditions.

For example, particles of 4000 Å or less which are present in helium gas at normal pressures having λ=4000 Å satisfy the conditions as specified above.

The temperature gradient required in the helium gas where the thermophoretic phenomenon is most liable to occur will now be discussed. When the average temperature of the gas is 300° C. and the temperature gradient around the substrate is 100° C./cm, Vt will be 0.4 cm/s. If the thickness of the gas flow on the substrate is 1 cm and the average linear velocity of gas flow U is 1 cm/s, all the particles produced will reach the substrate surface within 2.5 cm travel from the occurrence in the flow direction.

If the temperature gradient between the vapor phase and the substrate is decreased, the thermophoretic speed is lowered proportionally. If the thermophoretic speed is lower than that as described above, other conditions may be mitigated proportionally. Therefore, the diffusion and deposition of ultrafine particles onto the substrate according to the present invention, can sufficiently be effected even with a temperature gradient 10° C./cm, which is one tenth of the temperature gradient 100° C./cm as assumed above.

As the facility for the thermophoretic phenomenon to occur depends upon the atmosphere employed, a larger temperature gradient is preferred in an atmosphere where the thermophoretic phenomenon is rather difficult to occur.

In this connection, it is to be noted that a quotient of a difference between a vapor phase temperature and a substrate temperature divided by a radius of a reactor vessel is here defined as an average temperature gradient between the vapor phase and the substrate. It has been experimentally confirmed that sufficient thermophoretic phenomenon occurs if the temperature gradient is 10° C./cm or more. The configuration of the reactor vessel and the substrate are not limited and may vary. In this case, a quotient of a difference in temperatures between the vapor phase and the substrate divided by a thickness of gas flow on the substrate, which is so-called boundary layer thickness, is defined as an average temperature gradient.

As a kind of ceramic film to which the present invention can be applied, there may be mentioned a titanium oxide, a zirconium oxide, a silicon oxide, an aluminium oxide, a germanium oxide, a calcium oxide, a barium oxide, a strontium oxide, a lanthanum oxide, an yttrium oxide, a niobium oxide, a bismuth oxide, a molybdenum oxide, a lead oxide, or mixed oxides, a nitride such as aluminium nitride, silicon nitride, titanium nitride or boron nitride, a carbide such as silicon carbide, boron carbide, zirconium carbide or titanium carbide, molybdenum boride, chromium boride, molybdenum silicide, or the like. However, the kinds of ceramics are not limited to those as mentioned above, so long as the present invention is applicable. The present invention can further be applied to the preparation of a metal film by reduction reaction of compounds.

According to the present invention, ultrafine particles of ceramics are first produced in a vapor phase. These vapor phase reactions includes: thermal decomposition; hydrolysis or oxidation of alkoxides; hydrolysis or oxidation of halides; oxidation of alkylates; or oxidation of hydrogenates in the case of oxides; a reaction of halides with ammonia; thermal decomposition of halogenated metal added with ammonia; a reaction of metal vapor with ammonia or nitrogen or hydrazine; or thermal decomposition of nitrogen containing an organic aluminium compound which is typically aluminium alkylamide in the case of nitrides; or reduction of halides by hydrogen in the presence of hydrocarbon or directly by hydrocarbon in the case of carbides.

Alternatively, other reactions which have been known as vapor phase reactions for preparation of various ceramics can be employed. These vapor phase reactions have various reaction temperatures. For example, in the thermal decomposition of alkoxides, the reaction temperature is from 250° to 1500° C., in the hydrolysis of halides, it is from 50° to 1000° C., in the oxidation of alkylate, from 100° to 500° C., in the oxidation of hydrogenates, from 100° to 1000° C., in the reaction of halides with ammonia, from 400° to 1500° C., and in the reaction of metal vapor with ammonia or nitrogen, from a temperature lower by 50° C. than the boiling point of the metal to a temperature higher by 100° C. than the boiling point of the metal. In the thermal decomposition of the nitrogen containing organic aluminium compounds, typically aluminium alkylamide, the reaction temperature is from 300° C. to 1500° C.

In the present invention, the temperature of the vapor phase is within the temperature range as mentioned above in order to allow the reaction to proceed in the vapor phase so as to produce ultrafine particles.

In order to produce ultrafine particles in the vapor phase, conditions employed in the methods which have been known as methods for preparing ceramic ultrafine particles for the purpose of preparation of powders can also be employed. These conditions are disclosed, for example, in *Kagaku Sosetsu*, No. 9 "Inorganic reaction where solids participate", by Gakkai Shuppan Center, 1975, Sui Ozaki *Catalysis Preparing Chemistry*, by Kohdansha Scientific, Japanese patent publication (Kokoku) No. 46274/1972, and Japanese Patent Laid-Open (Kokai) No. 115190/1975.

The particle size of the ultrafine particles is 4000A or less so that the diffusion and deposition of the particles can be attained effectively. The smaller the size of the ultrafine particles, the smaller the pore opening of the resulting materials. The particle size of the ultrafine particles can be controlled by the density of the reactive materials, reaction temperature or residence time within a vapor phase. This is referred to in the above-mentioned *Kagaku Sosetsu* and *Chemical & Engineering News*, Vol. 62, No. 32, Aug. 1984.

As described above, the reaction temperature is varied depending upon the kinds of reactions. The optimum reaction temperature is also dependent upon the kinds of the compounds which are used as materials in the respective reactions. However, in order to cause the diffusion of the ultrafine particles towards the substrate, irrespective of the reaction temperature, there should be a temperature gradient of 10° C./cm or more between the vapor phase and the substrate.

The flow rate of the reacting gas to be supplied into the vapor phase is preferably from 0.1 to 100 cm/s of linear velocity, and the concentration of the reacting materials in the gas mixture with an inert gas to be added according to necessity is 0.01 to 10% of alkoxides in the case of thermal decomposition of alkoxides, 0.01 to 10% of halides and 1 to 20% of $H_2O$ in the case of hydrolysis of the halides, 0.01 to 10% of alkylates or hydrogenates and 1 to 99.9% of oxygen in the case of oxidation of alkylates or hydrogenates, 0.01 to 10% of halides and 1 to 99.9% of ammonia in the case of the reaction of halides with ammonia, 0.01 to 5% of metal vapor and 1 to 99.9% of ammonia or 10 to 99.9% of nitrogen in the case of the reaction of the metal vapor with ammonia or nitrogen, and 0.01 to 10% in the thermal decomposition of the nitrogen containing organic aluminum compounds.

According to the present invention, the temperature of the substrate is kept at a temperature where the vapor phase reaction occurs so that the vapor reaction proceeds on the surface of the ultrafine particles deposited on the substrate. The temperature at which the vapor phase reaction can proceed, is a temperature higher than the temperature which is known as the lowest temperature where the ultrafine particles producing reaction of the desired ceramics can occur. Such a lowest temperature is, for example, the lower limit of the reaction temperature of the above-mentioned vapor phase reaction, but it has, in the strict sense, a temperature range as follows:

The reaction rate is, in most cases, temperature dependent called 'Arrhenius' type and is described by $e^{-E/RT}$. E represents an activation energy, R is a gas constant and T is the reaction temperature. Now, it is assumed that the activation energy of the reaction having a reaction rate which is effective in the practical sense at a temperature of 500° C. is 40 Kcal/mol. At a temperature 480° C. which is lower by 20° C., the reaction rate will be about ½ but at 400° C. it will be 1/50. Further, at 300° C., it will be 1/10,000 and at 200° C., it will be 1/10,000,000 where the reaction is substantially suspended. In this case, the lower limit temperature is preferably 400° C. in practical use.

In the case of vapor synthesis reaction of solids, the rate of solid growth is in proportion to the surface area of the solids present. In this invention, since the total surface area of the film is much larger than that of the ultrafine particles thinly suspended within the vapor phase, the reaction can proceed at a temperature lower than that of the vapor phase.

As examples of the lower limit temperature of the substrate, in the preparation of a titanium oxide by a thermal decomposition of titanium tetraisopropoxide it is 200° to 230° C., 250° to 280° C. in the preparation of a zirconium oxide by a thermal decomposition of zirconium tetraisopropoxide, and 400° to 450° C. in the preparation of aluminium nitride by a reaction of aluminium chloride with ammonia gas.

The size of the ultrafine particles is controlled by selection of vapor phase conditions which include, flow rate of a gas, concentration of reactive materials, temperature of reaction, and so on. The rate of growth of the ultrafine particles on the substrate is controlled by the temperature of the substrate and the concentration of the reactive materials on the substrate which is determined by the above-mentioned conditions of the vapor phase and the configuration of the apparatus. Therefore, the size and rate of the void of the film can be selected at will.

The thickness of the film is determined by the thermophoretic phenomenon, but the weight of the film is determined by the thermophoretic phenomenon and the growth reaction on the substrate. Therefore, in order to obtain a higher density film, it is most effective to keep the temperature of the substrate higher than the lower limit temperature as described above so as to cause more growth reaction as compared with the thermophoretic phenomenon.

When the conditions are suitably selected, it can be possible to make the diameter of the voids of the ceramic film to be 4000 Å or less. The minimum diameter of the voids is such a limit length through which the reactive materials can be diffused into the film. This corresponds to the molecular diameter and varies depending upon the kinds of the reaction. It is necessary for all the molecules required for the respective reaction to be diffused into the film so that the reaction can proceed. The minimum diameter of the voids is determined by the diameter of the molecule which is the largest among the reacting molecules. For example, in the preparation of a metal nitride from a metal vapor and ammonia, the diameter of ammonia molecule is larger than that of the metal and is about 3.6 Å. In this case, therefore, the diameter of the voids can be reduced to 4 Å.

On the other hand, if the diameter of the ultrafine particles deposited on the substrate is 4000 Å at largest, the diameter of the voids can be reduced to lower than the diameter of these ultrafine particles.

The rate of the solids in the total volume of the ceramic film can be controlled to 10% or more. As the ultrafine particles growing in the vapor phase reaction may be aggregates of smaller ultrafine particles, the rate of the solids in the ultrafine particles themselves may sometimes be 30% or so. When such ultrafine particles are deposited, a bi-dispersed pore size distribution in the ceramic film having the rate of solids of 10% or so can be obtained. When dense ultrafine particles are deposited and the growth reaction proceeds sufficiently on the substrate, a film having the rate of solids of about 80% or more is obtained.

After the formation of the film as described above, the production or deposition of the ultrafine particles may be suspended, while allowing only the vapor reaction on the substrate. In this case, the density of the film can be increased.

With this respect, the present invention further features a process for preparing a ceramic film which is characterized by producing ultrafine particles of ceramics in a vapor phase by a vapor phase reaction; depositing the ultrafine particles produced in the vapor phase onto a substrate utilizing a thermophoretic phenomenon by forming a temperature gradient between the vapor phase and the substrate, while keeping the substrate at a temperature which is lower than the temperature of the vapor phase, where the ultrafine particles are being produced, but is capable of allowing the vapor phase reaction to proceed; further allowing the vapor reaction to proceed the ultrafine particles deposited on the substrate to form a ceramic film, and thereafter preventing the ultrafine particles from being deposited onto the substrate by at least one of raising the temperature of the substrate to higher than that of the vapor phase, lowering the temperature of the vapor phase to terminate the thermophoretic phenomenon and lowering the concentration of the reactive materials in the vapor phase to terminate the production of the ultrafine particles in the vapor phase, while allowing the vapor phase reaction to proceed within the formed ceramic film to lower the voids of the film.

In this case, after completion of the formation of the film as described above, at least one of the three measures in the following is taken so as to prevent the deposition of the ultrafine particles onto the substrate from the vapor phase:

(1) The temperature of the substrate is raised to higher than that of the vapor phase to stop the thermophoretic phenomenon.

(2) The temperature of the vapor phase is lowered to stop the thermophoretic phenomenon. When the temperature of the vapor phase is lowered, the production of the ultrafine particles itself may be prevented.

(3) The concentration of the reactive materials is lowered so as not to produce the ultrafine particles in the vapor phase any more.

On the other hand, the temperature of the substrate is kept within a range of the reaction temperature so as to allow the reaction on the substrate to proceed.

The present invention having the first feature may be carried out by an apparatus having a construction similar to that used in the conventional CVD method except that the substrate is kept at a specific temperature lower than that of the vapor phase. For example, the substrate is disposed in a reactor vessel wherein the vapor phase therein is heated by external heat and the substrate is cooled by a coolant supplied from the outside to effect temperature control. The heating system for the vapor phase may be of an infrared heating type or of a laser heating type. The substrate may be disposed horizontally in the reactor vessel and the reacting gas may be introduced so as to pass in parallel with the substrate. Or, the substrate may be disposed vertically in the reactor so that the gas introduced at a right angle to the substrate may flow in the sideward direction of the substrate or flow to the back of the substrate.

FIG. 1 is one form of the reaction apparatus used for carrying out the present invention. In FIG. 1, 1 is a reactor vessel and the vapor phase inside the reactor vessel 1 is heated by a heater 2. The reactor vessel 1 has a main body to which a member 5 inserting a substrate holder 4 in the reaction vessel 1 is tightly fitted, at a groundface portion 6, so as to hold a substrate 3 at the central portion of the main body. The substrate holder 4 has a hollow tubular structure and is provided with a coolant introducing tube 7 so as to introduce a coolant for cooling the substrate thereinto. The angle of the substrate can be adjusted by the substrate holder. The reactor vessel 1 further comprises a nozzle 8 for feeding a reacting gas from an end opposite to the substrate 3 to the vicinity of the substrate, a tube for feeding another reacting gas into the inside of the reaction vessel and an exit 10 for the gases. In the reaction apparatus of FIG. 1, for the vapor reaction using two kinds of gases, such as hydrolysis of halides, oxidation of alkylate or hydrogenates, a reaction between halides and ammonia, or between metal vapor and ammonia or nitrogen, the halides or metal vapor, etc. are fed through the nozzle 8 and a gas such as oxygen, nitrogen, etc. is introduced through the tube 9. When this reactor assembly is employed for a reaction using one kind of gas, such as a thermal decomposition of alkoxide, alkoxide is supplied through the nozzle 8 and the tube 9 is closed.

Figure 2:
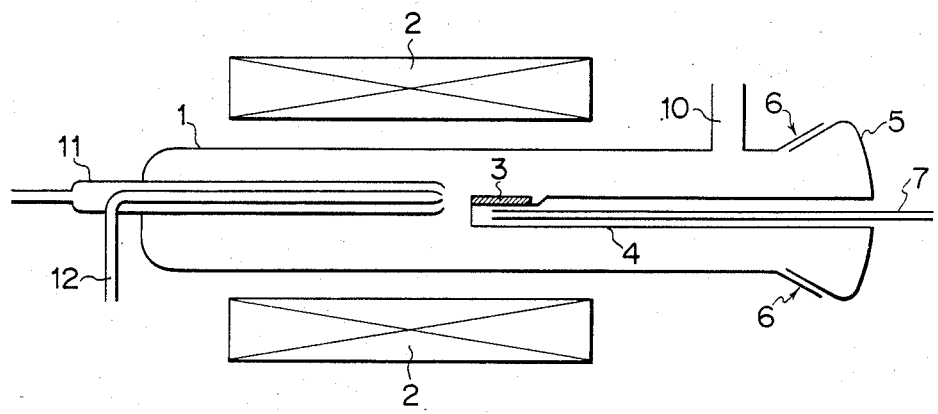
FIG. 2 is another form of a reaction apparatus employable to carry out the present invention.

FIG. 2 is another form of a reaction apparatus for carrying out the present invention. The basic structures of the apparatus such as a reactor vessel 1, heater 2, a substrate 3, a substrate holder 4, a substrate introducing member 5, a ground-face fitting portion 6 and an exit 10 are substantially the same as those of FIG. 1. In this reaction apparatus, however, a nozzle for feeding reacting gases has a dual structure comprising an outer nozzle 11 and an inner nozzle 12. The reaction apparatus as illustrated in FIG. 2 is suitable for obtaining mixed oxides by feeding two kinds of materials, for example, two kinds of alkoxides through the two nozzles, respectively, so as to subject them to a thermal decomposition. This assembly, however, may of course be applied for a reaction using one kind of reacting gas by using either of the nozzles.

The present invention of the second feature is also carried out by using a reaction apparatus similar to those as described above. In this case, after the film has been formed according to the first embodiment, the introduction of the coolant for cooling the substrate is stopped so as to render the temperature of the substrate same as that of the vapor phase. Alternatively, to positively raise the temperature of the substrate, a heating means, for example, a heater or a heating gas is introduced within the substrate holder to heat the substrate at the back thereof. Or, the reaction apparatus as illustrated may be employed and the concentration of the reacting materials in the feed gas may be lowered or the temperature of the vapor phase may be lowered.

According to the present invention, ultrafine particles of ceramics are produced in the vapor phase by a vapor phase reaction and the size of the ultrafine particles is controlled by the flow rate of the gas or gases, the concentration of the reactive material or materials, the reaction temperature, or the like. As the substrate is kept at a temperature lower than the temperature of the vapor phase, the ultrafine particles are deposited on the substrate utilizing the thermophoretic phenomenon. This allows rapid growth of the film.

Further, since the substrate is kept at a temperature where the vapor phase reaction can proceed, the vapor reaction proceeds at the surfaces of the ultrafine particles deposited on the substrate. These ultrafine particles are allowed to grow to fill up the void. Thus, a uniform film can be produced for all its rapid growth and the film can be a dense film.

Further according to the second feature of the invention, only the reaction on the substrate is allowed to proceed after the film has been formed. This enables the void of the film to be minimized.

EXAMPLE 1

A glass vessel, in which 20 g of $AlCl_3$ powder was charged, is kept at a temperature of 130° C. and helium gas was passed therethrough to prepare a gas flow I containing 3.2% of $AlCl_3$ vapor. Separately, a gas flow II containing 15% of $NH_3$ was prepared from $NH_3$ fed from an ammonia cylinder.

In a reaction apparatus as illustrated in FIG. 1 (having a heater length of 200 mm, a substrate holder diameter of 10 mm, a coolant introducing tube diameter of 5 mm, a nozzle diameter of 5 mm and an introducing tube diameter of 5 mm) provided with a reactor vessel of quartz and having a diameter of 30 mm and a full length of 500 mm, the gas flow I and the gas flow II were fed through the nozzle 8 and the introducing pipe 9, respectively, at a flow rate of 2000 ml/min. The temperature of the tip end portion of the nozzle 8 measured by a thermocouple was 800° C.

On the other hand, a substrate (10 mm × 10 mm) of quartz held by a substrate holder was inserted into the reactor vessel from an end opposite to the nozzle 8 and the substrate was cooled at its back by air so as to be kept at a temperature of 720° C. After one hour, a porous film (10 mm × 10 mm × 0.12 mm) having a specific surface area (BET $N_2$ adsorption) of 88 $m^2/g$ and a density of 1.1 g/ml (rate of solid: 34%) was obtained.

An average temperature gradient between the vapor phase and the substrate which was obtained by dividing a temperature difference (800° C.–720° C.) between the vapor phase and the substrate by a radius (15 mm) of the reactor vessel was 53.3° C./cm.

Figure 3:
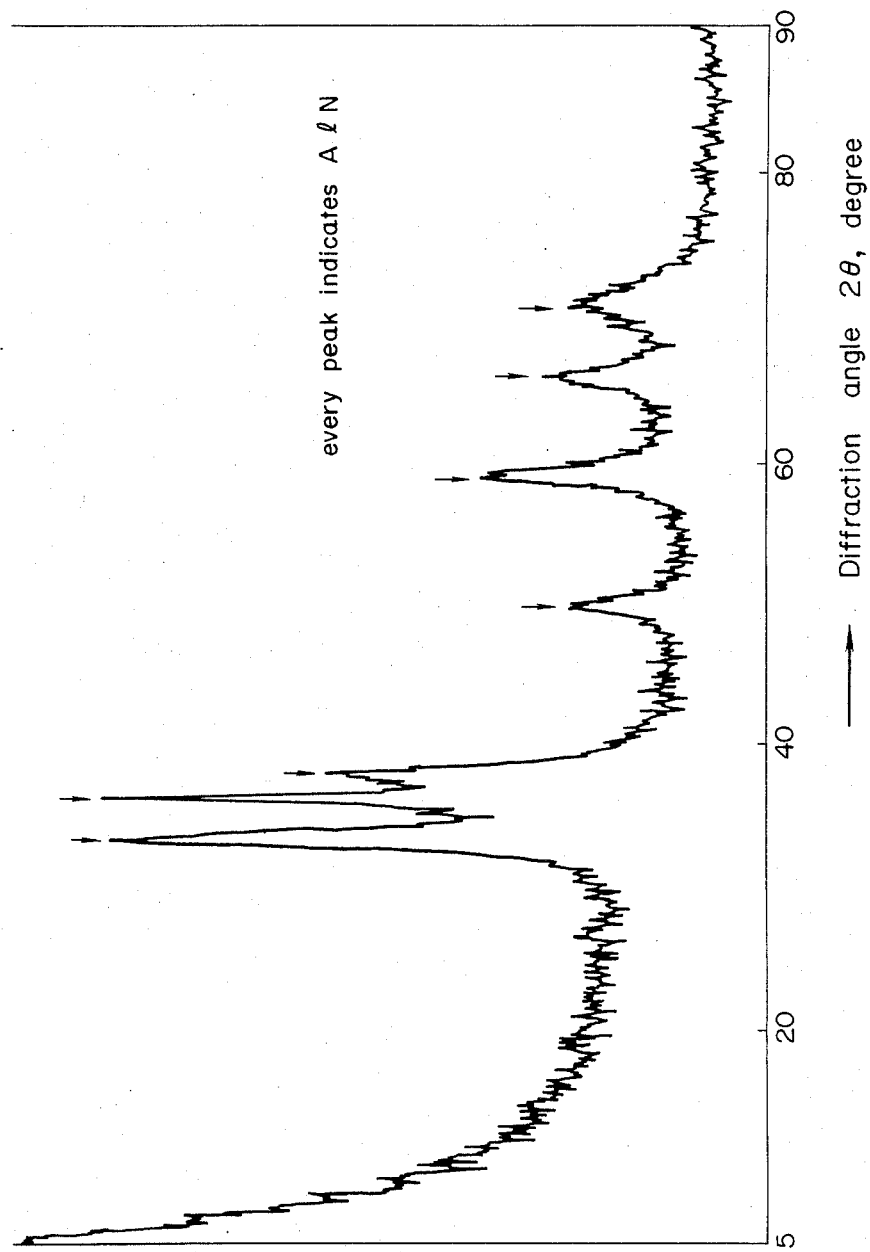
FIGS. 3, 4 and 5 are X-ray diffraction patterns of the ceramic films prepared in EXAMPLE 1, EXAMPLE 2 and EXAMPLE 3, respectively.

An X-ray diffraction pattern (used X-ray: Cu-Kα ray) of the prepared porous film is shown in FIG. 3. Nothing other than AlN were found in FIG. 3.

EXAMPLE 2

15 g of $Zr(OC_3H_7)_4$ is charged in a glass vessel and kept at a temperature of 230° C. to be molten. Helium gas is passed through the resultant molten liquid to prepare a gas flow III containing 1.1% of $Zr(OC_3H_7)_4$.

In a reaction apparatus as illustrated in FIG. 2 (having a heater length of 200 mm, a substrate holder diameter of 10 mm, a coolant introducing tube diameter of 4 mm, an outer nozzle diameter of 10 mm and an inner nozzle diameter of 5 mm) provided with a reactor vessel of silica glass and having a diameter of 40 mm and a full length of 400 mm, the gas flow III was fed through the outer nozzle 11 at a flow rate of 3000 ml/min. The inner nozzle was plugged. The temperature of the tip end portion of the nozzle 11 measured by a thermocouple was 400° C.

The substrate (10 mm × 10 mm) was cooled at its back by air so as to be kept at a temperature of 320° C. After one hour, a porous film (10 mm × 10 mm × 0.18 mm) having a specific surface area of 180 $m^2/g$ and a density of 2.1 g/ml (rate of solid: 35%) was obtained.

An average temperature gradient between the vapor phase and the substrate was 40° C./cm.

Figure 4:
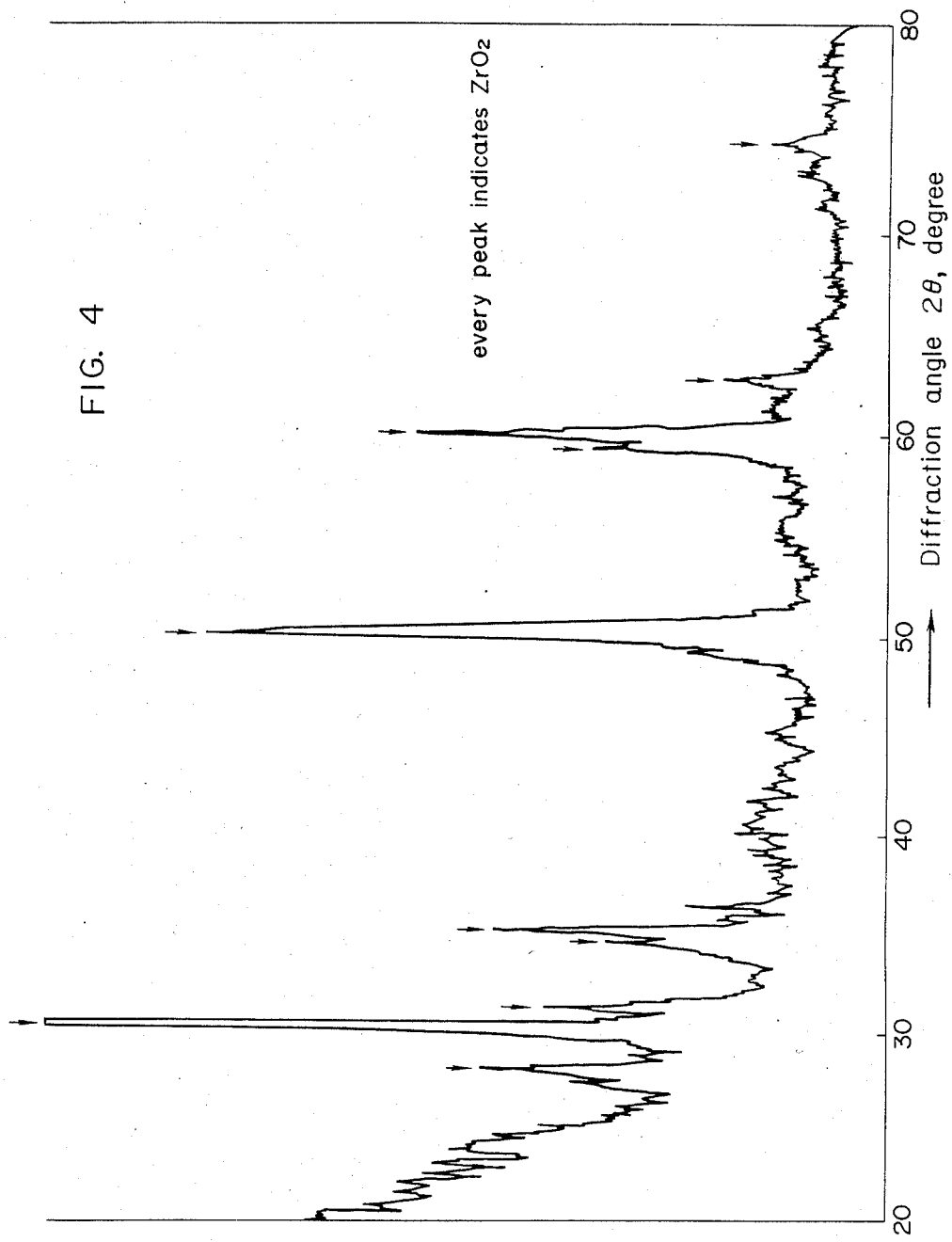

The elemental analysis by the X-ray diffraction and ICP (plasma emission spectroscopic analysis) of the obtained porous film showed that it had a purity of 98% or more. The X-ray diffraction pattern is shown in FIG. 4.

EXAMPLE 3

20 g of $Ti(OC_3H_7)_4$, which is liquid at ordinary room temperature, was charged in a glass vessel and kept at a temperature of 100° C. Helium gas was introduced into the material to prepare a gas flow IV containing 1.0% of $Ti(OC_3H_7)_4$.

In a reaction apparatus substantially the same as that used in EXAMPLE 2, the gas flow IV was fed into a reactor vessel through an inner nozzle 12 at a flow rate of 2000 ml/min. At the same time, a gas flow substantially the same as the gas flow III prepared in EXAMPLE 2 was fed through an outer nozzle 11 at a flow rate of 2000 ml/min. The temperatures of the nozzles 11 and 12 measured by a thermocouple were 420° C.

A substrate which was set in a manner similar to that of EXAMPLE 2 was kept at a temperature of 330° C. After one hour, a porous film (10 mm × 10 mm × 0.24 mm) having a specific surface area of 142 $m^2/g$ and a density of 1.8 g/ml (rate of solid: 45%) was obtained.

An average temperature gradient between the vapor phase and the substrate was 45° C./cm.

Figure 5:
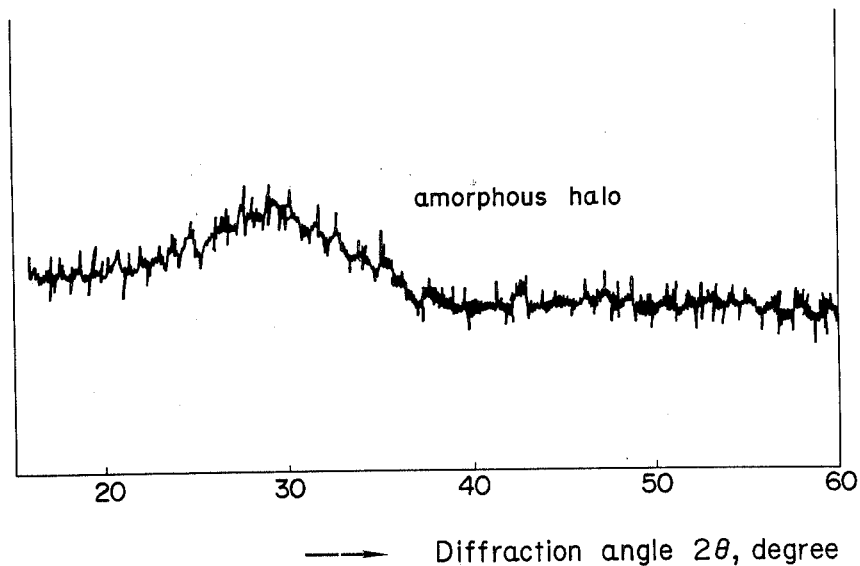

According to the elemental analysis by ICP, in terms of atom percent, Ti was 32%, Zr was 14% and C was less than 1%. The X-ray diffraction pattern revealed that only Halo showing an ammorphous state was obtained and the composition was such that content of $Ti_{0.71}Zr_{0.29}O_2$ was more than 90% and almost all of the balance was water. The X-ray diffraction pattern is shown in FIG. 5.

EXAMPLE 4

After an AlN porous film had been formed on the substrate by one hour reaction under the conditions of nozzle tip end temperature of 800° C. and the substrate temperature of 720° C. in the similar manner to that of EXAMPLE 1, the temperature of the vapor phase was lowered to 720° C. while keeping the substrate at a temperature of 720° C. These temperature were kept for 30 minutes and the resultant film had a density of 2.7 g/ml (rate of solid: 84%).

EXAMPLE 5

In a reaction apparatus substantially the same as that used in EXAMPLE 1, the gas flow I ($AlCl_3$ vapor) and the gas flow (helium gas containing 15% of $NH_3$) were fed into a reactor vessel at a flow rate of 2000 ml/min, respectively.

The tip end of a nozzle was kept at a temperature of 800° C. and a substrate was kept at a temperature of 786° C. After one-hour reaction, 30 g/ml (rate of solid: 93%) of a transparent dense film (10 mm × 10 mm × 0.09 mm) was obtained.

In this example, the temperature gradient between the vapor phase and the substrate was 10° C./cm.

Figure 6:
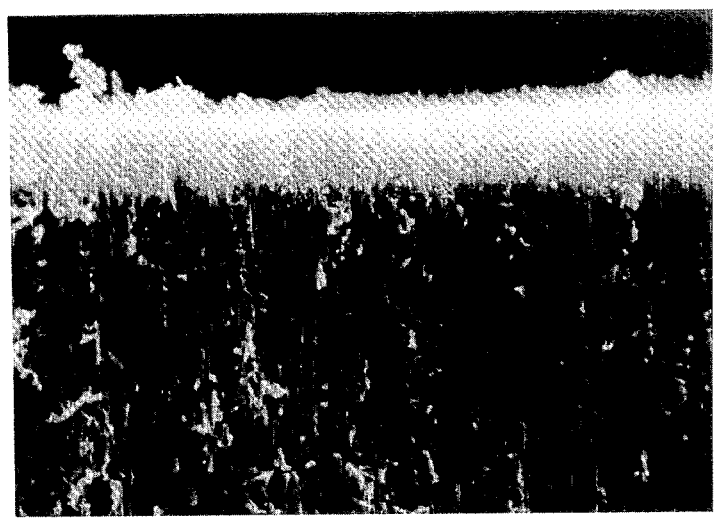
FIGS. 6 and 7 are a scanned electron micrograph and an X-ray diffraction pattern of the ceramic film prepared in EXAMPLE 5, respectively.
Figure 7:
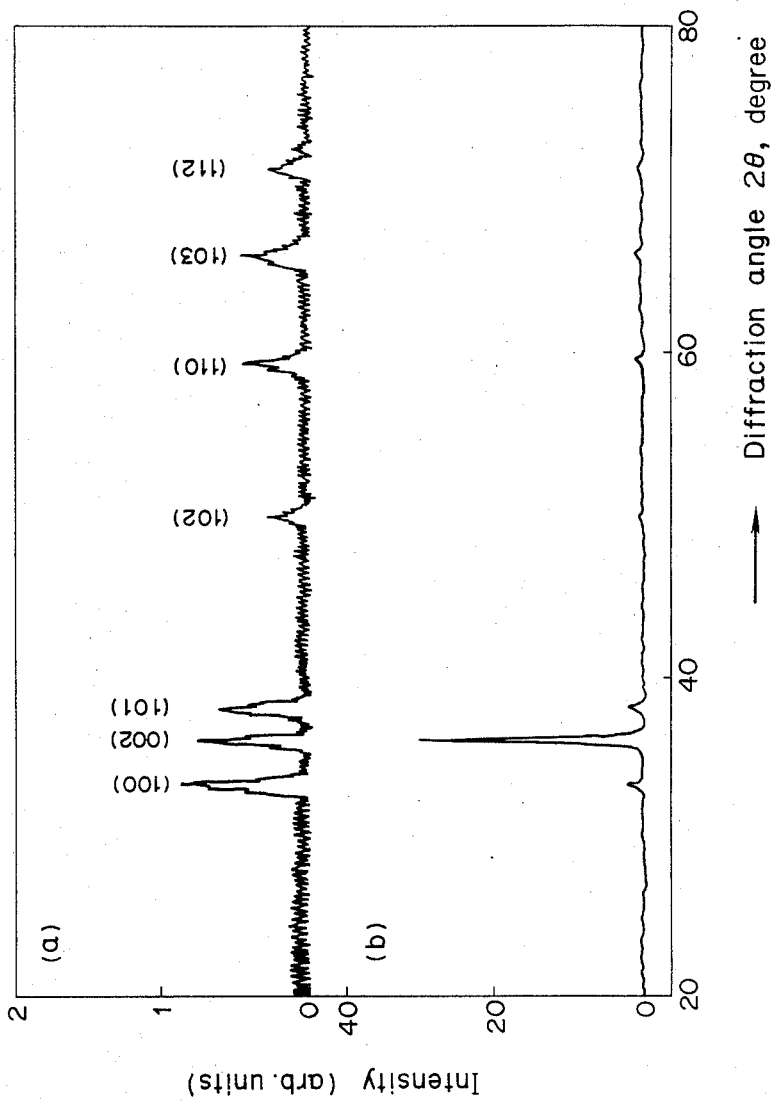

A scanned electron micrograph and an X-ray diffraction pattern of a section of the obtained dense film are shown in FIGS. 6 and 7, respectively. It was confirmed, from FIGS. 6 and 7, that the obtained film has a high degree of orientation in 002 plane.

COMPARATIVE EXAMPLE

A reaction was allowed to proceed in substantially the same manner as EXAMPLE 1 except that the substrate was kept at a temperature of 800° C. As a result, only a trace of solid deposited on the substrate was perceived.

In the present invention, the ultrafine particles are positively produced in the vapor phase as different from the conventional CVD method and they are deposited on the substrate, so that the growth speed of the film is very rapid, i.e., 100 um/hr or more which is 100 times as rapid as the conventional CVD method. In the conventional CVD method, the increase of the concentration of the reaction materials will possibly retard the growth of the film, but in the present invention, the increase in the concentration of the reactive materials will increase the production speed of the ultrafine particles in the vapor phase and therefore increase the growth speed of the film.

In addition, the size of the ultrafine particles may be controlled so as to adjust the size of void of the formed film to the size of the molecule of the starting material.

Further according to the present invention, since the production of the ultrafine particles, formation of the film and calcination of the film can be effected by one step, the product obtained can have a high purity.

Therefore, the film of ceramics produced according to the present invention can be applied to a sinterable matrix or other fields as a high-temperature gas separator material, an insulating material, a thermal insulating material, a carrier for catalysts, sensor, or the like wherein ceramics with fine cellular structure are needed.

I claim:

1. A process for preparing a ceramic film, which comprises: producing ultrafine particles of ceramic by a vapor phase reaction; providing a temperature gradient between a vapor phase and a substrate by holding the substrate at a temperature lower than that of the vapor phase where the ultrafine particles are produced, but high enough to allow the vapor phase reaction to proceed, allowing the ultrafine particles produced in the vapor phase to be deposited onto the substrate by a thermophoretic phenomenon; and allowing the vapor phase reaction to proceed on the ultrafine particles deposited on the substrate.

2. A process for preparing a ceramic film as claimed in claim 1, wherein the average temperature gradient formed between the vapor phase and the substrate is 10° C./cm or more.

3. A process for preparing a ceramic film as claimed in claim 1, wherein the diameter of the ultrafine particles produced in the vapor phase is 4000 Å or less.

4. A process for preparing a ceramic film as claimed in claim 1, wherein the diameter of the voids formed in the ceramic porous film is 4000 Å or less.

5. A process for preparing a ceramic film, which comprises: producing ultrafine particles of ceramic in a vapor phase by a vapor phase reaction; depositing the ultrafine particles produced in the vapor phase onto a substrate utilizing a thermophoretic phenomenon by forming a temperature gradient between the vapor phase and the substrate, while keeping the substrate at a temperature which is lower than the temperature of the vapor phase where the ultrafine particles are being produced, but is capable of allowing the vapor phase reaction to proceed; further allowing the vapor phase reaction to proceed on the ultrafine particles deposited on the substrate to form a ceramic film, and thereafter preventing the ultrafine particles from being deposited onto the substrate by at least one of (1) raising the temperature of the substrate to a temperature higher than that of the vapor phase, (2) lowering the temperature of the vapor phase to terminate the thermophoretic phenomenon and (3) lowering the concentration of the reactive materials in the vapor phase to terminate the production of the ultrafine particles in the vapor phase, while allowing the vapor reaction to proceed within the formed ceramic film to lower the content of voids of the film.

6. A process for preparing a ceramic film as claimed in claim 5, wherein the average temperature gradient formed between the vapor phase and the substrate is 10° C./cm or more.

7. A process for preparing a ceramic film as claimed in claim 5, wherein the diameter of the ultrafine particles produced in the vapor phase is 4000 Å or less.

8. A process for preparing a ceramic film as claimed in claim 5, wherein the diameter of the voids formed in the ceramic porous film is 4000 Å or less.

9. A process for preparing a ceramic film, which comprises:

placing a substrate inside a vessel; continuously feeding at least one stream of reactant gas effective to produce a ceramic into said vessel and directing said stream toward said substrate, said stream being heated to a first temperature effective to cause a vapor phase reaction that produces ultrafine particles of ceramic in the vapor phase, maintaining said substrate at a second temperature which is lower than said first temperature and provides a temperature gradient of at least 10° C./cm between said vapor phase and said substrate so that the ultrafine particles are transported to and deposited on said substrate by thermophoresis whereby to form a film of said ultrafine particles on said substrate, said second temperature being sufficiently high that the vapor phase reaction can continue in contact with said film; stopping transport and deposition of the ultrafine particles on the substrate while maintaining the temperature of said substrate and the flow of reactant gas at levels effective to cause the vapor phase reaction to proceed in contact with the surfaces of the ultrafine particles within the film after the film has been formed on said substrate whereby to increase the density of the film by filling the voids in the film.

* * * * *